US008575472B2

(12) United States Patent
Murata et al.

(10) Patent No.: US 8,575,472 B2
(45) Date of Patent: Nov. 5, 2013

(54) PHOTOELECTRIC CONVERSION DEVICE AND METHOD FOR PRODUCING SAME

(75) Inventors: Kazuya Murata, Izumisano (JP); Mitsuhiro Matsumoto, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 13/523,323

(22) Filed: Jun. 14, 2012

(65) Prior Publication Data

US 2012/0266948 A1  Oct. 25, 2012

Related U.S. Application Data

(63) Continuation of application No. PCT/JP2010/072346, filed on Dec. 13, 2010.

(30) Foreign Application Priority Data

Dec. 15, 2009  (JP) ................................. 2009-283877

(51) Int. Cl.
*H01L 31/00*  (2006.01)

(52) U.S. Cl.
USPC ........................................................ 136/255

(58) Field of Classification Search
USPC ................................................ 136/243–265
See application file for complete search history.

(56) References Cited

U.S. PATENT DOCUMENTS 6,384,319 B1 * 5/2002 Sasaki et al. .................. 136/258

FOREIGN PATENT DOCUMENTS

| JP | 10-294482 A | 11/1998 |
|----|-------------|---------|
| JP | 2000-077694 A | 3/2000 |
| JP | 2003-158276 A | 5/2003 |
| JP | 2003-188400 A | 7/2003 |
| JP | 2004-179371 A | 6/2004 |
| JP | 2004-335823 A | 11/2004 |
| JP | 2007-243142 A | 9/2007 |
| JP | 2008-283075 A | 11/2008 |

OTHER PUBLICATIONS

English Translation of Yoji et al., Japanese Publication No. JP2003158276.*
International Search Report for PCT Application No. PCT/JP2010/072346 dated Jan. 11, 2011, pp. 1-3.

* cited by examiner

*Primary Examiner* — Alicia Toscano
*Assistant Examiner* — Niki Bakhtiari
(74) *Attorney, Agent, or Firm* — Ditthavong Mori & Steiner, P.C.

(57) ABSTRACT

In order to increase photoelectric conversion efficiency in a photoelectric conversion device, there is disclosed a photoelectric converter containing a photoelectric conversion unit in which a p-type layer (40) containing a p-type dopant, an i-type layer (42) that is a microcrystalline silicon layer that is an electricity-generating layer, and an n-type layer (44) containing an n-type dopant are layered, wherein the p-type layer (40) is caused to have a layered structure comprising a first p-type layer (40a) that is a microcrystalline silicon layer, and a second p-type layer (40b) containing at least one of an amorphous silicon carbide p-type layer and an amorphous silicon p-type layer disclosed between the microcrystalline silicon p-type layer (40a) and the i-type layer (42). The second p-type layer (40b) is provided with an oxide layer on the side of the i-type layer (42).

11 Claims, 3 Drawing Sheets

PHOTOELECTRIC CONVERSION DEVICE AND METHOD FOR PRODUCING SAME

CROSS-REFERENCE TO RELATED APPLICATION

The present application is a continuation application of International Application No. PCT/JP2010/072346, filed Dec. 13, 2010, the entire contents of which are incorporated herein by reference and priority to which is hereby claimed. The PCT/JP2010/072346 application claimed the benefit of the date of the earlier filed Japanese Patent Application No. 2009-283877, filed Dec. 15, 2009, the entire contents of which are incorporated herein by reference, and priority to which is hereby claimed.

TECHNICAL FIELD

The present invention relates to a photoelectric conversion device and a method for producing the same.

BACKGROUND ART

A solar cell made from polycrystalline silicon, microcrystalline silicon or amorphous silicon is well known. Especially, with respect to resource consumption and from the viewpoint that a reduction in costs and an increase in efficiency is desirable, the focus has been on a photoelectric conversion device having a laminated structure composed of microcrystalline silicon or amorphous silicon thin films.

Generally, a photoelectric conversion device is produced by laminating, on the insulating surface of a substrate, a first electrode, one or more semiconductor thin film photoelectric conversion cells, and a second electrode, in the stated order. The individual photoelectric conversion units for the device are formed by laminating a p-type layer, an i-type layer and an n-type layer, beginning on the light incidence side. A well known method for increasing the conversion efficiency of the photoelectric conversion device is the stacking of two or more types of photoelectric conversion cells in the direction of the incidence of light. For the photoelectric conversion device, a first photoelectric conversion unit, which includes a photoelectric conversion layer having a large bandgap, is arranged on the light incidence side, and behind this unit, a second photoelectric conversion unit is arranged that includes a photoelectric conversion layer having a bandgap narrower than that of the first photoelectric conversion unit. With this arrangement, photoelectric conversion can be performed for a wide wavelength range of incident light, and an overall increase in the conversion efficiency is obtained for the device. For example, a structure is well known wherein an amorphous silicon (a-Si) photoelectric conversion unit is employed as a top cell and a microcrystalline silicon (μc-Si) photoelectric conversion unit is employed as a bottom cell. Above all, attention has been drawn to a structure wherein amorphous silicon and microcrystalline silicon are deposited in the stated order, on a translucent substrate, and light is permitted to enter and impinge on the substrate face, and with this structure, an integrated large-area module can be easily provided and the size of the area of the translucent substrate that does not contribute to photoelectric conversion can be reduced.

A technology is also disclosed whereby a microcrystalline silicon thin film containing impurities and an amorphous silicon thin film, which also contains impurities, are laminated, in order, to reduce the grain boundary of an electricity-generating layer or an intercrystalline defect, and to increase photoelectric conversion efficiency. Especially disclosed are the deposition of a p-type microcrystalline thin film and a p-type amorphous silicon thin film on a back-contact electrode, which is located on the side opposite the light incidence side, and the application of amorphous silicon or amorphous carbide silicon for the p-type amorphous silicon thin film (see, for example, patent literature 1).

CITATION LIST

Patent Literature

PTL 1: JP 10-294482A

SUMMARY OF INVENTION

Technical Problem

For a conventional photoelectric conversion device, wherein an electricity-generating unit (a top cell), which employs amorphous silicon as an electricity-generating layer, and an electricity-generating unit (a bottom cell), which employs microcrystalline silicon as an electricity-generating layer, are stacked, in the stated order, and the amorphous silicon layer side is located on the light incident side, the structure is employed wherein a microcrystalline silicon layer is employed as an n-type layer for a top cell, a p-type microcrystalline layer (or a p-type microcrystalline silicon carbide layer) is overlaid, and a microcrystalline silicon electricity-generating layer is deposited that contacts the p-type layer. According to this structure, however, a problem that occurred is that when the film properties (a crystalline fraction, a rate of doping, etc.) of the n-type microcrystalline silicon layer of the top cell and the p-type microcrystalline silicon layer of the bottom cell are changed, the crystallinity of the microcrystalline silicon electricity-generating layer is also changed, and deviates from the optimal film property. Since adjustment for the optimal film property can not be independently performed for the individual layers, it is very difficult for the most appropriate conditions to be introduced to fabricate a photoelectric conversion device by stacking two or more types of photoelectric conversion cells. Furthermore, after maintenance has been performed for an apparatus for producing photoelectric conversion devices, or after a predetermined number of substrates have been processed, re-adjustment of the fabrication conditions for the individual microcrystalline silicon layers of the bottom cell is required because the fabrication conditions are very critical, and at this time, the same problem occurs for the re-adjustment procedure, greatly affecting the production output in a case involving mass production.

In a case wherein the laminated structure of a p-type microcrystalline silicon layer and a p-type amorphous silicon layer is located on the side opposite the light incident side, the junction characteristic is hardly affected by the crystallinity of the interfacial layer between the p-type microcrystalline silicon layer and the microcrystalline silicon electricity-generating layer. However, when the laminated structure described above is arranged on the light incidence side, the junction characteristic is greatly affected by the crystallinity of the interfacial layer between the p-type microcrystalline silicon layer and the electricity-generating layer, and when the crystalline fraction for the interfacial layer is low, an increase in the photoelectric conversion efficiency may be prevented. Therefore, a technique is required for preventing a reduction in the crystalline fraction in the vicinity of the interface of the i-type layer, even in a case where the structure is provided by laminating, on the p-type layer, the p-type microcrystalline silicon layer and the p-type amorphous silicon layer, and is arranged on the light incidence side.

Solution to Problem

One aspect of the present invention is a photoelectric conversion device including a photoelectric conversion unit, in which a p-type layer containing a p-type dopant, an i-type layer that is a microcrystalline silicon layer serving as an electricity-generating layer, and an n-type layer containing an n-type dopant are laminated, wherein the p-type layer has a layered structure formed of a first p-type layer, which is a microcrystalline silicon layer, and a second p-type layer, which is disposed between a p-type microcrystalline silicon layer and an i-type layer, and includes, at least one of a p-type amorphous silicon layer and a p-type amorphous silicon carbide layer.

Another aspect of the present invention is a method, for producing a photoelectric conversion device that includes a photoelectric conversion unit wherein a p-type layer containing a p-type dopant, an i-type layer that is a microcrystalline silicon layer and serves as an electricity-generating layer, and an n-type layer containing an n-type dopant are laminated, comprising the steps of forming, as p-type layers, a first p-type layer that is a microcrystalline silicon layer, and forming, between a p-type microcrystalline silicon layer and an i-type layer, a second p-type layer that includes, at least one of a p-type amorphous silicon layer or an p-type amorphous silicon carbide silicon layer; and oxidizing an i-type layer side of the second p-type layer.

Advantageous Effects of Invention

According to the present invention, the photoelectric conversion efficiency for a photoelectric conversion device can be improved, and the production efficiency of the photoelectric conversion device can be increased.

DESCRIPTION OF EMBODIMENT

Figure 1:
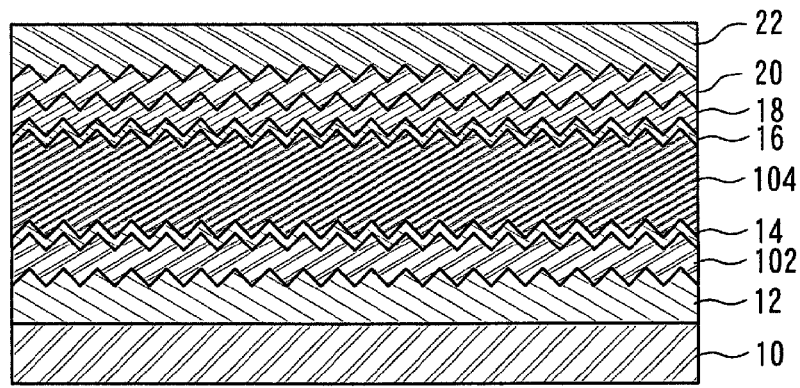
FIG. 1 is a diagram illustrating the structure of a photoelectric conversion device according to one embodiment of the present invention.

FIG. 1 is a cross-sectional view of the structure of a photoelectric conversion device 100 according to one embodiment of the present invention. The photoelectric conversion device 100 of this embodiment has a structure provided by laminating, in order, beginning at the side of a transparent insulating substrate 10, which is the light incidence side, a transparent conductive film 12, an amorphous silicon (a-Si) (photoelectric conversion) unit 102, which is a top cell having a large bandgap, an intermediate layer 14, a microcrystalline silicon (μc-Si) (photoelectric conversion) unit 104, which is a bottom cell having a smaller bandgap than the a-Si unit 102, a first back-contact electrode layer 16, a second back-contact electrode layer 18, a filling material 20 and a protective layer 22.

The structure of the photoelectric conversion device 100 and a method for producing this device will now be described for the embodiment of the present invention.

For the transparent insulating substrate 10, a material, such as a glass substrate or a plastic substrate, that is optically transparent at least within the wavelength range of visible light, can be employed. The transparent conductive film 12 is deposited on the transparent insulating substrate 10. It is appropriate for the transparent conductive film 12 to be provided by employing at least one of transparent conductive oxides (TCO), such as stannic oxide ($SnO_2$), zinc oxide (ZnO) and indium tin oxide (ITO) doped with tin (Sn), antimony (Sb), fluorine (F), aluminum (Al), etc. Especially, zinc oxide (ZnO) is appropriate because the optical transmittance is high, the electrical resistivity is low and the plasma resistivity is superior. The transparent conductive film 12 can be formed by using sputtering, for example. The appropriate range for the film thickness of the transparent conductive film 12 can be from equal to or greater than 0.5 μm to equal to or smaller than 5 μm. Further, it is preferable that the surface of the transparent conductive film 12 be uneven, so as to provide light confinement effects.

Silicon thin films of a p-type layer, an i-type layer and an n-type layer are deposited in the stated order on the transparent conducive film 12 to form the a-Si unit 102. To form the a-Si unit 102, a plasma CVD method can be employed whereby film deposition is performed by using plasma activation on a gas mixture of a silicon-containing gas, such as silane ($SiH_4$), disilane ($Si_2H_6$) or dichlorosilane ($SiH_2Cl_2$), a carbon-containing gas such as methane ($CH_4$), a p-type dopant containing gas such as diborane ($B_2H_6$), an n-type dopant containing gas such as phosphine ($PH_3$), and a gas that has been diluted with hydrogen ($H_2$), etc.

It is preferable that RF plasma CVD at 13.56 MHz, for example, be applied for the plasma CVD method. A parallel-plate model can be employed for RF plasma CVD. Further, gas release holes for supplying a mixture of source gases may be formed on the side of a parallel-plate electrode where the transparent insulating substrate 10 is not provided. The plasma power density is preferably equal to or greater than 5 mW/cm$^2$ to equal to or smaller than 100 mW/cm$^2$.

Generally, the p-type layer, the i-type layer and the n-type layer are deposited in different deposition chambers. A vacuum pump is employed to exhaust gas in the deposition chambers to establish a vacuum state, and electrodes for RF plasma CVD are internally provided. Furthermore, a transfer device for the transparent insulating substrate 10, a power source and a matching device for RF plasma CVD, and gas supply piping are provided.

The p-type layer is formed on the transparent conductive layer 12. The p-type layer is either a p-type amorphous silicon layer (p-type a-Si:H) or a p-type amorphous silicon carbide (p-type a-SiC:H) that has been doped with a p-type dopant (boron, etc.) and that has a thickness of from 10 nm or greater to 100 nm or smaller. The properties of the p-type layer can be changed by adjusting the mixing ratio for a silicon-containing gas, a carbon-containing gas, a p-type dopant containing gas and a diluted gas, and the pressure and high frequency power used for plasma generation. It is preferable that the structure of the p-type layer be provided, for example, by laminating a high-absorption amorphous silicon carbide layer (a p1 layer), which has been doped with boron at a high density, and a low-absorption amorphous silicon carbide layer (a p2 layer), which has been doped with boron at a lower density than that for the high-absorption amorphous silicon carbide layer. At this time, it is preferable that film deposition be performed by employing an RF plasma CVD method, at a power density of 11 mW/cm$^2$, under conditions wherein source gases are supplied under a reaction pressure of 80 Pa at the substrate temperature of 180° C. For deposition of the high-absorption amorphous silicon carbide layer (p1 layer), it is preferable that as source gases, silane ($SiH_4$), methane ($CH_4$), hydrogen ($H_2$) and diboron ($B_2H_6$) be supplied at flow rates of 40 sccm, 80 sccm, 400 sccm and 12 sccm (diluted to 1%), respectively. For deposition of the low-absorption amorphous silicon carbide layer (p2 layer), it is preferable that as source gases, silane ($SiH_4$), methane ($CH_4$), hydrogen ($H_2$) and diboron ($B_2H_6$) be supplied at flow rates of 40 sccm, 80 sccm, 400 sccm and 1 sccm (diluted to 1%), respectively. The preferable thicknesses of the high-absorption amorphous carbide silicon layer (p1 layer) and the low-absorption amorphous carbide silicon layer (p2 layer) are 7 nm and 3 nm, respectively. The i-type layer is a non-doped amorphous silicon film that is deposited on the p-type layer and has a thickness of 50 nm or greater to 500 nm or smaller. The properties of the i-type layer can be changed by adjusting a mixing ratio for a silicon-containing gas and a diluted gas, and the pressure and the high-frequency power used for plasma generation. Furthermore, the i-type layer is employed as an electricity-generating layer for the a-Si unit 102. Further, it is preferable that the structure of the i-type layer be provided by, for example, laminating a top cell buffer layer, which is an amorphous silicon carbide layer, and the common i-type layer, which is an amorphous silicon layer. At this time, moreover, it is preferable that the top cell buffer layer be deposited by using an RF plasma CVD method at a power density of 11 mW/cm$^2$ under conditions wherein source gases are supplied, under a reaction pressure of 80 Pa, at a substrate temperature of 180° C. For deposition of the top cell buffer layer, it is preferable that, as source gasses, silane ($SiH_4$), methane ($CH_4$) and hydrogen ($H_2$) be supplied at flow rates of 20 sccm, 10 sccm and 2000 sccm, respectively. Furthermore, a preferable film thickness for the top cell buffer layer is 10 nm. It is preferable, moreover, that the common i-type layer, which is an amorphous silicon layer, be deposited by plasma CVD at a power density of 11 mW/cm$^2$, under conditions where source gasses are supplied under a reaction pressure of 100 Pa, at a substrate temperature of 180° C. For deposition of the normal i-type layer, it is preferable that, as source gasses, silane ($SiH_4$) and hydrogen ($H_2$) be supplied at flow rates of 300 sccm and 1000 sccm, respectively. Further, a preferable thickness for a normal i-type layer is 300 nm. The n-type layer is an n-type amorphous silicon layer (an n-type a-Si:H) or an n-type microcrystalline silicon layer (an n-type μc-Si:H), which is formed on the i-type layer, and has a thickness of 10 nm or greater to 100 nm or smaller and has been doped with an n-type dopant (phosphorus, etc.). The properties of the n-type layer can be changed by adjusting a mixing ratio for a silicon-containing gas, a carbon-containing gas, an n-type dopant containing gas and a diluted gas, the pressure, and high frequency power for plasma generation. It is preferable that the n-type layer be deposited by, for example, RF plasma CVD at a power density of 110 mW/cm$^2$, under conditions wherein source gases are supplied, under a reaction pressure of 200 Pa, at a substrate temperature of 180° C. For the deposition of the n-type layer, it is preferable that, as source gases, silane ($SiH_4$), hydrogen ($H_2$) and phosphine ($PH_3$) be supplied at flow rates of 10 sccm, 2000 sccm and 5 sccm (diluted to 1%), respectively. A preferable film thickness of the n-type layer is 20 nm.

Deposition of the intermediate layer 14 is performed on the a-Si unit 102. It is preferable that transparent conductive oxide, such as zinc oxide (ZnO) or silicon oxide ($SiO_x$), be employed for the intermediate layer 14. Especially, either zinc oxide (ZnO) or silicon oxide ($SiO_x$) that has been doped with magnesium Mg is preferable. Further, sputtering, for example, can be used to form the intermediate layer 14. A preferable film thickness of the intermediate layer 14 is within the range of from equal to or greater than 10 nm to equal to or smaller than 200 nm. It should be noted that the intermediate layer 14 may not always be formed.

Figure 2:
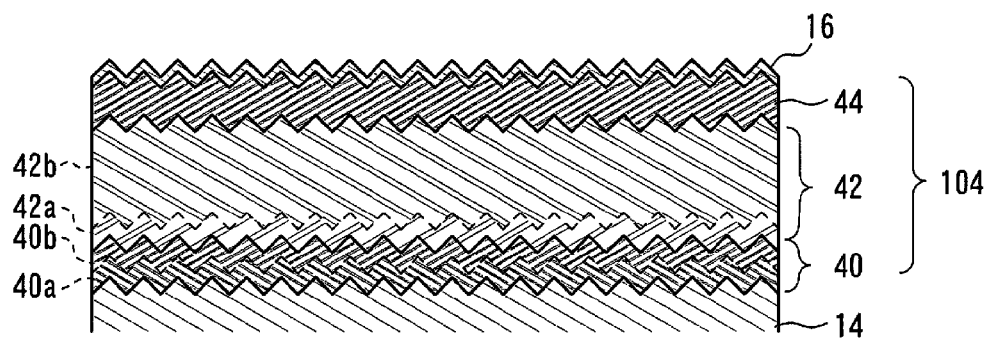
FIG. 2 is a diagram illustrating the structure of the μc-Si unit of the photoelectric conversion device according to the embodiment of the present invention.

As shown in the enlarged cross-sectional view in FIG. 2, a p-type layer 40, an i-type layer 42 and an n-type layer 44 are laminated on the intermediate layer 14, in the stated order, to provide the μc-Si unit 104. The μc-Si unit 104 can be formed by performing plasma CVD, whereby deposition is performed through plasma activation of a gas mixture of a silicon-containing gas, such as silane ($SiH_4$), disilane ($Si_2H_6$) or dichlorosilane ($SiH_2Cl_2$), a carbon-containing gas such as methane ($CH_4$), a p-type dopant containing a gas such as diboron ($B_2H_6$), an n-type dopant containing gas such as phosphine ($PH_3$) and a gas that has been diluted with hydrogen ($H_2$), etc.

As in the case for the a-Si unit 102, it is preferable that an RF plasma CVD of 13.56 MHz, for example, be applied for the plasma CVD method. A parallel-plate model can be employed for RF plasma CVD. Further, gas release holes for supplying a mixture of source gases may be formed on the side of a parallel-plate electrode where the transparent insulating substrate 10 is not provided. It is preferable that the plasma power density be 5 mW/cm$^2$ or higher to 100 mW/cm$^2$ or lower.

The p-type layer 40 is formed on the intermediate layer 14, or on the n-type layer of the a-Si unit 102. In this embodiment, at least two layers, i.e., a first p-type layer 40a, which is a microcrystalline silicon layer, and a second p-type layer 40b, which is an amorphous layer, are laminated to provide the p-type layer 40. It is preferable that the amorphous layer be either an amorphous silicon (a-Si) layer or an amorphous silicon carbide (a-SiC) layer.

A preferable film thickness of the first p-type layer 40a is 5 nm or greater to 50 nm or smaller. When an a-Si layer is employed as the second p-type layer 40b, a film thickness of 1 nm or greater to 4.5 nm or smaller is appropriate. Furthermore, when an a-SiC layer is employed as the second p-type layer 40b, a film thickness of 1 nm or greater to 4.5 nm or smaller is appropriate.

The properties of the first p-type layer 40a and the second p-type layer 40b can be changed by adjusting a mixing ratio for a silicon-containing gas, a carbon-containing gas, a p-type dopant containing gas and a diluted gas, the pressure, and high-frequency power for plasma generation.

Therefore, a process for oxidizing the second p-type layer 40b is performed. Preferably, for example, when the second p-type layer 40b has been formed, the transparent insulating substrate 10 is removed from the vacuum chamber of an in-line deposition system, and is exposed to the air to perform oxidization. It is preferable that oxidization be performed so that the oxygen atom density of from $1 \times 10^{20}$/cm$^3$ or higher to $1 \times 10^{22}/cm^3$ or lower be detected by using secondary ion mass spectrometry (SIMS). Specifically, when the primary ion species $Cs^+$ are emitted by the Cameca SIMS apparatus (IMF-4F) at an acceleration voltage of 14.5 kV and a primary ion current of 15 nA under a degree of vacuum of $1 \times 10^{-7}$ Torr or lower, preferably, the oxygen atom density of $1 \times 10^{20}/cm^3$ or higher to $1 \times 10^{22}/cm^3$ or lower should be detected.

As described above, since the oxidization process is performed for the second p-type layer 40b that has been deposited, the surface layer of the second p-type layer 40b is oxidized, the interface state (defect state) of the interface relative to the i-type layer 42, which is deposited on the second p-type layer 40b, is reduced, and the output voltage of the photoelectric conversion device 100 is increased.

Further, the method for performing the oxidization process while the p-type layer 40b is exposed to the air is especially effective for a case where a large number of substrates should be processed during a single cycle for each device for fabricating the a-Si unit 102, which is a top cell, and a small number of substrates should be processed during a single cycle for each device for fabricating the μc-Si unit 104, which is a bottom cell. That is, when the a-Si unit and the p-type layer 40b are deposited by the fabrication device for the a-Si unit 102, and thereafter, the entire substrate is temporarily removed from the a-Si unit 102 fabrication device and is exposed to the air, a period lasting until the entire structure has been transferred to the fabrication device for the μc-Si unit 104 can be employed as a time for adjusting takt time. Furthermore, when many layers are formed by the a-Si unit 102 fabrication device that can process a large number of substrates in a single cycle, the operating efficiency of the fabrication device can be improved, without increasing the number of fabrication devices for the μc-Si unit 104.

When the film thickness of the p-type layer 40b is set to smaller than 1 nm, satisfactory effects can not be provided by depositing the p-type layer 40b, and when the film thickness is greater than 4.5 nm, the series resistance of the p-type layer 40 is increased and there is a possibility that a short-circuit current and a fill factor will occur.

Additionally, when an a-SiC layer is employed as the p-type layer 40b, the bandgap can be widened more than when the a-Si layer is applied. As a result, since the open circuit voltage of the photoelectric conversion device 100 can be further increased, and optical absorption loss at the p-type layer 40 can also be reduced, the short-circuit current is increased.

The i-type layer 42 is formed on the p-type layer 40. Mainly, the i-type layer is a non-doped microcrystalline silicon film, deposited on the p-type layer 40, that has a thickness of 0.5 μm or greater to 5 μm or smaller. The i-type layer 42 serves as an electricity-generating layer for the μc-Si unit 104.

In this embodiment, it is preferable that the structure of the i-type layer 42 be provided by forming a buffer layer 42a that contacts the p-type layer 40, and forming a main electricity-generating layer 42b on the buffer layer 52a. The buffer layer 42a is formed under deposition conditions for which the crystalline fraction is higher than that for the deposition conditions of the main electricity-generating layer 42b. It should be noted that the buffer layer 42a may be a p-type layer to which a p-type dopant has been added.

Specifically, it is preferable that the buffer layer 42a be formed by the RF plasma deposition method of 13.56 MHz, while a gas mixture where a hydrogen ($H_2$) to silane ($SiH_4$) dilution ratio is 130 or greater to 800 or smaller is introduced at a pressure of 200 Pa. Further, it is preferable that the substrate temperature for deposition be 80° C. or higher to 250° C. or lower, and that power provided for supplying plasma be 30 $mW/cm^2$ or higher to 1000 $mW/cm^2$ or lower. It is also preferable that the main electricity-generating layer 42b be deposited by the RF plasma deposition method of 13.56 MHz, while a gas mixture, for which a hydrogen ($H_2$) to silane ($SiH_4$) dilution ratio is 30 or greater to 200 or smaller, be introduced at a pressure of 600 Pa. It is, moreover, preferable that the substrate temperature of deposition be 80° C. or higher to 250° C. or lower, and that power provided for supplying plasma be 30 $mW/cm^2$ or lower to 3000 $mW/cm^2$. Here, VHF plasma of 27 MHz, etc., may be employed for deposition.

When the buffer layer 42a is formed, the crystalline fraction of the i-type layer 42 is increased in the vicinity of the interface at the p-type layer 40, and in addition, the crystalline fraction for the entire i-type layer 42, which serves as the electricity-generating layer for the μc-Si unit 104, is increased, so that the photoelectric conversion efficiency of the photoelectric conversion device 100 can be improved.

A preferable film thickness for the buffer layer 42a is 8 nm or greater to 100 nm or smaller. When the film thickness is less than 8 nm, satisfactory effects are not provided by inserting the buffer layer 42a, and when the film thickness is greater than 100 nm, there is a probability that photoelectric conversion characteristics, such as a fill factor FF, may be degraded.

Figure 3:
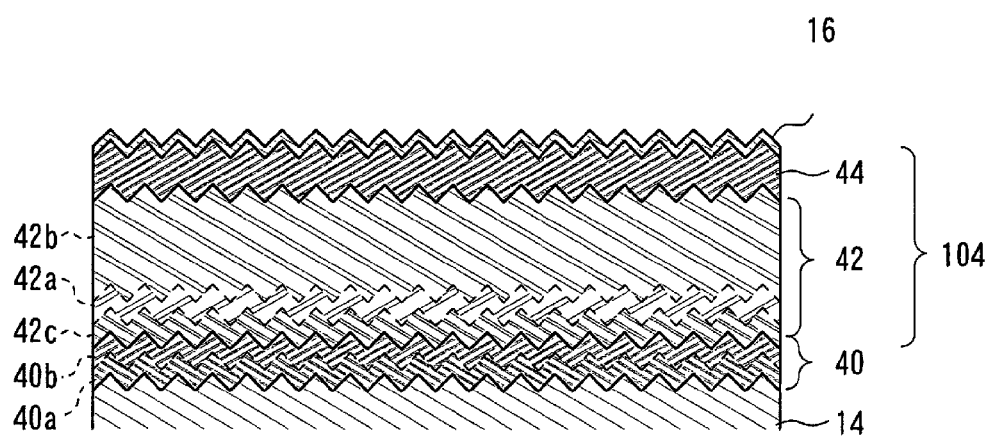
FIG. 3 is a diagram illustrating the structure of the μc-Si unit of the photoelectric conversion device according to the embodiment of the present invention.

It is also preferable that, as shown in the enlarged cross-sectional view in FIG. 3, in addition to the buffer layer 42a, which is a microcrystalline silicon layer, a buffer layer 42c, which is an amorphous silicon layer, be formed between the p-type layer 40 and the buffer layer 42a. The buffer layer 42c can be formed by employing the general deposition conditions for an amorphous silicon layer, and is preferably formed by using the RF plasma deposition method of 13.56 MHz, for example, while a gas mixture having a hydrogen ($H_2$) to silane ($SiH_4$) dilution ratio of 10 or smaller is introduced under a pressure of 100 Pa. It is preferable, moreover, that the substrate temperature for deposition be 80° C. or higher to 250° C. or lower, and that power provided for supplying plasma be 5 $mW/cm^2$ or higher to 100 $mW/cm^2$ or lower. For the buffer layer 42c, a preferable film thickness is equal to or greater than 1 nm to equal to or smaller than 5 nm.

Since the buffer layer 42c, which is an amorphous silicon layer, is deposited as the base between the p-type layer 40 and the buffer layer 42a, the crystalline fraction for the buffer layer 42a can be increased without being affected by the p-type layer 40. As a result, series resistance in the μc-Si unit 104 can be reduced, and a short-circuit current can be increased.

It should be noted here that at least one of two structures—one where two layers are formed to provide the p-type layer 40 and one where the buffer layers 42a and 42c are deposited for the i-type layer 42—may be employed. Of course, when the two structures are both employed, operational effects provided by both of them can be obtained.

The n-type layer 44 is formed on the i-type layer 42. This n-type layer 44 is an n-type microcrystalline silicon layer (an n-type μc-/Si:H) that has been doped with an n-type dopant (phosphorus, etc.), and that has a thickness of 5 nm or greater to 50 nm or smaller. However, the μc-Si unit 104 is not limited to the structure explained here, and a structure is available wherein an i-type microcrystalline silicon layer (an i-type μc-Si:H), explained below, is employed as an electricity-generating layer.

On the μc-Si unit 104, a first back-contact electrode layer 16 and a second back-contact electrode layer 18 are formed as a laminated structure of reflective metal and a transparent conductive oxide (TCO). For the first back-contact electrode layer 16, a transparent conductive oxide (TCO), such as stannic oxide ($SnO_2$), zinc oxide (ZnO) or indium tin oxide (ITO), is employed. The TCO can be deposited by sputtering, for example. For the second back-contact electrode layer 18, a metal such as silver (Ag) or aluminum (Al) can be employed. It is preferable that the thicknesses of the first back-contact electrode layer 16 and the second back-contact electrode layer 18 be about 1 μm in total. It is also preferable that at least either the first back-contact electrode 16 or the second back-contact electrode 18 be formed with a rough surface in order to improve a light confinement effect.

Further, the surface of the second back-contact electrode 18 is covered with a protective film 22 using a filling material 20. The filling material 20 and the protective film 22 can be a resin material, such as EVA or polyimide. Thus, the entry of water, etc., to the electricity-generating layer of the photoelectric conversion device 100 can be prevented.

It should be noted that the transparent conductive film 12, the a-Si unit 102, the intermediate layer 14, the μc-Si unit 104, the first back-contact electrode layer 16 and the second back-contact electrode layer 18 may be separated by using a YAG laser (having a 1064-nm fundamental wavelength and a 532-nm second harmonic wavelength), and a structure wherein a plurality of cells are connected in series may be provided.

EXAMPLES

Examples of the present invention and comparison examples will be given below.

Comparison Example 1

A 33 cm×43 cm glass substrate having a thickness of 4 mm was employed as the transparent insulating substrate 10. The transparent conductive film 12, with a rough surface, 600 nm of $SnO_2$ was deposited on the transparent insulating substrate 10 using thermal CVD. Thereafter, a YAG laser was employed to form a strip pattern on the transparent conductive film 12. The YAG laser employed was one having a wavelength of 1064 nm, an energy density of 13 J/cm$^2$ and a pulse frequency of 3 kHz.

Sequentially, thereafter, the p-type layer, the i-type layer and the n-type layer of the a-Si unit 102 were laminated, in the stated order. The deposition of the p-type layer, the i-type layer and the n-type layer of the a-Si unit 102 was performed under the deposition conditions shown in Table 1. Thereafter, the transparent insulating substrate 10 was removed from the deposition chamber, and the n-type layer of the a-Si unit 102 was exposed to the air and oxidized. In the following explanation, diboron ($B_2H_6$) and phosphine ($PH_3$) are represented using flow rates in a case of hydrogen-base gases at a concentration of 1%.

TABLE 1

| | Layer | Substrate Temp. (° C.) | Gas Flow Rate (sccm) | Reaction Pressure (Pa) | RF Power (W) | Film Thickness (nm) |
|---|---|---|---|---|---|---|
| a-Si unit 102 | p-type layer (p1) High-absorption amorphous silicon carbide layer | 180 | $SiH_4$: 40 $CH_4$: 80 $H_2$: 400 $B_2H_6$: 12 | 80 | 30 (11 mW/cm$^2$) | 7 |
| | p-type layer (p2) Low-absorption amorphous silicon carbide layer | 180 | $SiH_4$: 40 $CH_4$: 80 $H_2$: 400 $B_2H_6$: 1 | 80 | 30 (11 mW/cm$^2$) | 3 |
| | Top cell buffer layer | 180 | $SiH_4$: 20 $CH_4$: 10 $H_2$: 2000 | 80 | 30 (11 mW/cm$^2$) | 10 |
| | i-type layer | 180 | $SiH_4$: 300 $H_2$: 1000 | 100 | 30 (11 mW/cm$^2$) | 300 |
| | n-type layer | 180 | $SiH_4$: 10 $H_2$: 2000 $PH_3$: 5 | 200 | 300 (110 mW/cm$^2$) | 20 |

Following this, the μc-Si unit 104 was deposited on the n-type layer of the a-Si unit 102. The p-type layer 40, the i-type layer 42 and the n-type layer 44 of the μc-Si unit 104 were formed under the deposition conditions shown in Table 2.

TABLE 2

| | Layer | Substrate Temp. (° C.) | Gas Flow Rate (sccm) | Reaction Pressure (Pa) | RF Power (W) | Film Thickness (nm) |
|---|---|---|---|---|---|---|
| μc-Si unit 104 | p-type layer 40 | 180 | $SiH_4$: 10 $H_2$: 2000 $B_2H_6$: 5 | 200 | 300 (110 mW/cm$^2$) | 10 |
| | i-type layer 42 | 180 | $SiH_4$: 50 $H_2$: 3000 | 600 | 600 (220 mW/cm$^2$) | 2000 |
| | n-type layer 44 | 180 | $SiH_4$: 10 $H_2$: 2000 $PH_3$: 5 | 200 | 300 (110 mW/cm$^2$) | 20 |

Then, a Y laser beam was emitted on the portion 50 μm beside the position where pattern forming was performed for the transparent conductive film 12, and strip patterns for the a-Si unit 102 and the μc-Si unit 104 were formed. A YAG laser having an energy density 0.7 J/cm² and a pulse frequency of 3 kHz was employed.

Thereafter, as the first back-contact electrode layer 16, a ZnO film was deposited by sputtering, and as the second back-contact electrode layer 18, an Ag electrode was also formed by sputtering. Then, the YAG laser beam was emitted on the portion 50 μm beside the position where pattern forming was performed for the a-Si unit 102 and the μc-Si unit 104, and strip patterns were formed for the first back-contact electrode layer 16 and the second back-contact electrode layer 18. Here, a YAG laser having an energy density of 0.7 J/cm² and a pulse frequency of 4 kHz was employed.

Comparison Example 2

As in comparison example 1, the transparent conductive film 12 was formed on the transparent insulating substrate 10, and a strip pattern was formed by a YAG laser. Then, a p-type layer, an i-type layer and an n-type layer were laminated, in the stated order, to provide the a-Si unit 102, and the deposition conditions in Table 3 were employed for the deposition of the p-type layer, the i-type layer and the n-type layer of the a-Si unit 102. Thereafter, under the conditions in Table 3, the p-type layer 40 of the μc-Si unit 104 was deposited as a single layer, without the transparent insulating substrate 10 being removed from the deposition chamber.

layer 40 for the μc-Si unit 104. The i-type layer 42 and the n-type layer 44 of the μc-Si unit 104 were deposited under the deposition conditions shown in Table 4.

TABLE 4

| Layer | | Substrate Temp. (° C.) | Gas Flow Rate (sccm) | Reaction Pressure (Pa) | RF Power (W) | Film Thickness (nm) |
|---|---|---|---|---|---|---|
| μc-Si unit 104 | i-type layer 42 | 180 | SiH₄: 50<br>H₂: 3000 | 600 | 600<br>(220 mW/cm²) | 2000 |
| | n-type layer 44 | 180 | SiH₄: 10<br>H₂: 2000<br>PH₃: 5 | 200 | 300<br>(110 mW/cm²) | 20 |

Thereafter, the first back-contact electrode layer 16 and the second back-contact electrode layer 18 were deposited, and pattern forming was performed in the same manner as in comparison example 1.

Example 1

As in comparison example 1, the transparent conductive film 12 was formed on the transparent insulating substrate 10, and a strip pattern was formed by a YAG laser. Then, a p-type layer, an i-type layer and an n-type layer were laminated, in the named order, to provide the a-Si unit 102. The deposition -type layer, the i-type layer and the n-type layer of the a-Si

TABLE 3

| Layer | | Substrate Temp. (° C.) | Gas Flow Rate (sccm) | Reaction Pressure (Pa) | RF Power (W) | Film Thickness (nm) |
|---|---|---|---|---|---|---|
| a-Si unit 102 | p-type layer (p1) High-absorption amorphous silicon carbide layer | 180 | SiH₄: 40<br>CH₄: 80<br>H₂: 400<br>B₂H₆: 12 | 80 | 30<br>(11 mW/cm²) | 7 |
| | p-type layer (p2) Low-absorption amorphous silicon carbide layer | 180 | SiH₄: 40<br>CH₄: 80<br>H₂: 400<br>B₂H₆: 1 | 80 | 30<br>(11 mW/cm²) | 3 |
| | Top cell buffer layer | 180 | SiH₄: 20<br>CH₄: 10<br>H₂: 2000 | 80 | 30<br>(11 mW/cm²) | 10 |
| | i-type layer | 180 | SiH₄: 300<br>H₂: 1000 | 100 | 30<br>(11 mW/cm²) | 300 |
| | n-type layer | 180 | SiH₄: 10<br>H₂: 2000<br>PH₃: 5 | 200 | 300<br>(110 mW/cm²) | 20 |
| μc-Si unit 104 | p-type layer 40 | 180 | SiH₄: 10<br>H₂: 2000<br>B₂H₆: 5 | 200 | 300<br>(110 mW/cm²) | 10 |

Following this, the transparent insulating substrate 10 was removed from the deposition chamber, and the p-type layer 40, which was formed as a single layer, for the μc-Si unit 104, was exposed to the air for oxidization. Consecutively thereafter, the μc-Si unit 104 was formed on the oxidized p-type unit 102. Thereafter, under the conditions in Table 5, the first conditions in Table 5 were employed for deposition of the pp-type layer 40*a* and the second p-type layer 40*b* of the μc-Si unit 104 were formed, without the transparent insulating substrate 10 being removed from the deposition chamber.

TABLE 5

| | Layer | Substrate Temp. (° C.) | Gas Flow Rate (sccm) | Reaction Pressure (Pa) | RF Power (W) | Film Thickness (nm) |
|---|---|---|---|---|---|---|
| a-Si unit 102 | p-type layer (p1) High-absorption amorphous silicon carbide layer | 180 | $SiH_4$: 40 $CH_4$: 80 $H_2$: 400 $B_2H_6$: 12 | 80 | 30 (11 mW/cm$^2$) | 7 |
| | p-type layer (p2) Low-absorption amorphous silicon carbide layer | 180 | $SiH_4$: 40 $CH_4$: 80 $H_2$: 400 $B_2H_6$: 1 | 80 | 30 (11 mW/cm$^2$) | 3 |
| | Top cell buffer layer | 180 | $SiH_4$: 20 $CH_4$: 10 $H_2$: 2000 | 80 | 30 (11 mW/cm$^2$) | 10 |
| | i-type layer | 180 | $SiH_4$: 300 $H_2$: 1000 | 100 | 30 (11 mW/cm$^2$) | 300 |
| | n-type layer | 180 | $SiH_4$: 10 $H_2$: 2000 $PH_3$: 5 | 200 | 300 (110 mW/cm$^2$) | 20 |
| μc-Si unit 104 | p-type layer 40a | 180 | $SiH_4$: 10 $H_2$: 2000 $B_2H_6$: 5 | 200 | 300 (110 mW/cm$^2$) | 10 |
| | p-type layer 40b | 180 | $SiH_4$: 100 $H_2$: 1000 $B_2H_6$: 50 | 100 | 30 (11 mW/cm$^2$) | 3 |

Following this, the transparent insulating substrate 10 was removed from the deposition chamber, and the second p-type layer 40b for the μc-Si unit 104 was exposed to the air for oxidization. Thereafter, the μc-Si unit 104 was formed on the oxidized, second p-type layer 40b. The i-type layer 42 and the n-type layer 44 of the μc-Si unit 104 were deposited under the deposition conditions shown in Table 4 in the same manner as for the comparison example 2. Thereafter, the first back-contact electrode layer 16 and the second back-contact electrode layer 18 were deposited and pattern forming was performed in the same manner as in comparison example 1.

Example 2

As in example 1, the transparent conductive film 12, the p-type layer, the i-type layer and the n-type layer of the a-Si unit 102, and the first p-type layer 40a and the second p-type layer 40b of the μc-Si unit 104 were deposited on the transparent insulating substrate 10. Following this, the transparent insulating substrate 10 was removed from the deposition chamber, and the second p-type layer 40b for the μc-Si unit 104 was exposed to the air for oxidization.

Thereafter, the μc-Si unit 104 was formed on the oxidized second p-type layer 40b. The buffer layer 42a and the main electricity-generating layer 42b for the μc-Si unit 104 were laminated to provide the i-type layer 42, and the n-type layer 44 was formed on the i-type layer 42. The deposition conditions shown in Table 6 were employed for deposition of the i-type layer 42 and the n-type layer 44. Thereafter, the first back-contact electrode layer 16 and the second back-contact electrode layer 18 were deposited and pattern forming was performed in the same manner as in comparison example 1.

TABLE 6

| | Layer | Substrate Temp. (° C.) | Gas Flow Rate (sccm) | Reaction Pressure (Pa) | RF Power (W) | Film Thickness (nm) |
|---|---|---|---|---|---|---|
| μc-Si unit 104 | Buffer layer 42a | 180 | $SiH_4$: 8 $H_2$: 2000 | 200 | 300 (110 mW/cm$^2$) | 10 |
| | Main electricity-generating layer 42b | 180 | $SiH_4$: 50 $H_2$: 3000 | 600 | 600 (220 mW/cm$^2$) | 2000 |
| | n-type layer 44 | 180 | $SiH_4$: 10 $H_2$: 2000 $PH_3$: 5 | 200 | 300 (110 mW/cm$^2$) | 20 |

Example 3

As well as in example 1, the transparent conductive film 12, the p-type layer, the i-type layer and the n-type layer of the a-Si unit 102 were formed on the transparent insulating substrate 10. Further, the first p-type layer 40a and the second p-type layer 40b of the μc-Si unit 104, as shown in Table 7, were deposited. At this time, the second p-type layer 40b was an amorphous silicon carbide layer. Following this, the transparent insulating substrate 10 was removed from the deposition chamber, and the second p-type layer 40b for the μc-Si unit 104 was exposed to the air for oxidization.

TABLE 7

| | Layer | Substrate Temp. (° C.) | Gas Flow Rate (sccm) | Reaction Pressure (Pa) | RF Power (W) | Film Thickness (nm) |
|---|---|---|---|---|---|---|
| a-Si unit 102 | p-type layer (p1) High-absorption amorphous silicon carbide layer | 180 | $SiH_4$: 40 $CH_4$: 80 $H_2$: 400 $B_2H_6$: 12 | 80 | 30 (11 mW/cm$^2$) | 7 |
| | p-type layer (p2) Low-absorption amorphous silicon carbide layer | 180 | $SiH_4$: 40 $CH_4$: 80 $H_2$: 400 $B_2H_6$: 1 | 80 | 30 (11 mW/cm$^2$) | 3 |
| | Top cell buffer layer | 180 | $SiH_4$: 20 $CH_4$: 10 $H_2$: 2000 | 80 | 30 (11 mW/cm$^2$) | 10 |
| | i-type layer | 180 | $SiH_4$: 300 $H_2$: 1000 | 100 | 30 (11 mW/cm$^2$) | 300 |
| | n-type layer | 180 | $SiH_4$: 10 $H_2$: 2000 $PH_3$: 5 | 200 | 300 (110 mW/cm$^2$) | 20 |
| μc-Si unit 104 | p-type layer 40a | 180 | $SiH_4$: 10 $H_2$: 2000 $B_2H_6$: 5 | 200 | 300 (110 mW/cm$^2$) | 10 |
| | p-type layer 40b | 180 | $SiH_4$: 100 $CH_4$: 100 $H_2$: 1000 $B_2H_6$: 50 | 100 | 30 (11 mW/cm$^2$) | 3 |

Thereafter, the μc-Si unit 104 was formed on the oxidized, second p-type layer 40b. As in example 2, the deposition conditions shown in Table 6 were employed for deposition of the i-type layer 42 and the n-type layer 44 for the μc-Si unit 104. Thereafter, the first back-contact electrode layer 16 and the second back-contact electrode layer 18 were deposited and pattern forming was performed in the same manner as in comparison example 1.

Example 4

As in example 3, the transparent conductive film 12, the p-type layer, the i-type layer and the n-type layer of the a-Si unit 102, and the first p-type layer 40a and the second p-type layer 40b of the μc-Si unit 104 were deposited on the transparent insulating substrate 10. Following this, the transparent insulating substrate 10 was removed from the deposition chamber, and the second p-type layer 40b for the μc-Si unit 104 was exposed to the air for oxidization.

Thereafter, the μc-Si unit 104 was formed on the oxidized, second p-type layer 40b. The buffer layer 42a, the buffer layer 42c and the main electricity-generating layer 42b for the μc-Si unit 104 were laminated to provide the i-type layer 42, and the n-type layer 44 was formed on the i-type layer 42. The deposition conditions shown in Table 8 were employed for deposition of the i-type layer 42 and the n-type layer 44. Thereafter, the first back-contact electrode layer 16 and the second back-contact electrode layer 18 were deposited and pattern forming was performed in the same manner as in comparison example 1.

TABLE 8

| | Layer | Substrate Temp. (° C.) | Gas Flow Rate (sccm) | Reaction Pressure (Pa) | RF Power (W) | Film Thickness (nm) |
|---|---|---|---|---|---|---|
| μc-Si unit 104 | Buffer layer 42c | 180 | $SiH_4$: 300 $H_2$: 1000 | 100 | 30 (11 mW/cm$^2$) | 3 |
| | Buffer layer 42a | 180 | $SiH_4$: 8 $H_2$: 2000 | 200 | 300 (110 mW/cm$^2$) | 10 |
| | Main electricity-generating layer 42b | 180 | $SiH_4$: 50 $H_2$: 3000 | 600 | 600 (220 mW/cm$^2$) | 2000 |
| | n-type layer 44 | 180 | $SiH_4$: 10 $H_2$: 2000 $PH_3$: 5 | 200 | 300 (110 mW/cm$^2$) | 20 |

Example 5

As in example 3, the transparent conductive film 12, the p-type layer, the i-type layer and the n-type layer of the a-Si unit 102 and the first p-type layer 40a and the second p-type layer 40b of the μc-Si unit 104 were deposited on the transparent insulating substrate 10. Following this, the transparent insulating substrate 10 was removed from the deposition chamber, and the second p-type layer 40b, for the μc-Si unit 104, was exposed to the air for oxidization.

Consecutively, the μc-Si unit 104 was formed on the second p-type layer 40b that had been oxidized. For the μc-Si unit 104, under the deposition conditions in Table 9, the buffer layer 42a and the main electricity-generating layer 42c were laminated on the second p-type layer 40b to provide the i-type layer 42, and the n-type layer 44 was formed on the i-type layer 42. In this example, boron that is a p-type dopant was added to the buffer layer 42a to provide the p-type layer. Thereafter, the first back-contact electrode layer 16 and the second back-contact electrode layer 18 were deposited and pattern forming was performed in the same manner as in comparison example 1.

TABLE 9

| | Layer | Substrate Temp. (° C.) | Gas Flow Rate (sccm) | Reaction Pressure (Pa) | RF Power (W) | Film Thickness (nm) |
|---|---|---|---|---|---|---|
| μc-Si unit 104 | Buffer layer 42a | 180 | $SiH_4$: 8<br>$H_2$: 2000<br>$B_2H_6$: 4 | 200 | 300 (110 mW/cm$^2$) | 10 |
| | Main electricity-generating layer 42b | 180 | $SiH_4$: 50<br>$H_2$: 3000 | 600 | 600 (220 mW/cm$^2$) | 2000 |
| | n-type layer 44 | 180 | $SiH_4$: 10<br>$H_2$: 2000<br>$PH_3$: 5 | 200 | 300 (110 mW/cm$^2$) | 20 |

Example 6

For example 6, thickness dependence of the second p-type layer 40b in example 3 was examined. The photoelectric conversion efficiency was measured, not only for a case where the second p-type layer 40b was not formed, but also for a case where the thickness of the second p-type layer 40b was changed from 1 nm to 10 nm.

Example 7

For example 6, thickness dependence of the buffer layer 42a in example 3 was examined. The photoelectric conversion efficiency was measured, not only for a case where the buffer layer 42a was not formed, but also for a case where the thickness of the buffer layer 42a was changed up to 30 nm.

Example 8

For example 8, dependence on a hydrogen ($H_2$) to silane ($SiH_4$) dilution ratio at the time of formation of the buffer layer 42a was examined. The hydrogen ($H_2$) to silane ($SiH_4$) dilution ratio was changed in a range of 50 to 400.

Comparison Example 3

As in comparison example 1, the transparent conductive film 12 was formed on the transparent insulating substrate 10, and a strip pattern was formed by a YAG laser. Then, formation of the a-Si unit 102 was not performed, while under the deposition conditions in Table 2, the p-type layer 40, the i-type layer 42 and the n-type layer 44 were deposited to provide the μc-Si unit 104. Thereafter, the first back-contact electrode layer 16 and the second back-contact electrode layer 18 were deposited and pattern forming was performed in the same manner as in comparison example 1.

Example 9

As in comparison example 1, the transparent conductive film 12 was formed on the transparent insulating substrate 10, and a strip pattern was formed by a YAG laser. Then, formation of the a-Si unit 102 was not performed, while the first p-type layer 40a and the second p-type layer 40b were formed under the deposition conditions shown in Table 7, and the second p-type layer 40b was exposed to the air for oxidization, and thereafter, the i-type layer 42 and the n-type layer 44 for the μc-Si unit 104 were formed under the deposition conditions shown in Table 6. Thereafter, the first back-contact electrode layer 16 and the second back-contact electrode layer 18 were deposited and pattern forming was performed in the same manner as in comparison example 1.

Example 10

As in comparison example 1, the transparent conductive film 12 was formed on the transparent insulating substrate 10, and a strip pattern was formed by a YAG laser. Then, the a-Si unit 102 was formed in the same manner as in comparison example 1. Then, the whole structure was temporarily removed outside, and thereafter, a p-type semiconductor layer for the μc-Si unit 104 was formed, as shown in Table 10. For the p-type layer, a p-type crystalline silicon semiconductor layer was formed, and then a p-type amorphous silicon carbide semiconductor layer was deposited. Following this, an i-type microcrystalline silicon layer (buffer layer), and an i-type microcrystalline silicon layer and an n-type crystalline silicon layer were formed. Thereafter, the first back-contact electrode layer 16 and the second back-contact electrode layer 18 were deposited and pattern forming was performed in the same manner as in comparison example 1.

TABLE 10

| Layer | | Substrate Temp. (°C.) | Gas Flow Rate (sccm) | Reaction Pressure (Pa) | RF Power (W) | Film Thickness (nm) |
|---|---|---|---|---|---|---|
| μc-Si unit 104 | p-type layer 40a | 108 | $SiH_4$: 10<br>$H_2$: 2000<br>$B_2H_6$: 5 | 200 | 300 (110 mW/cm²) | 10 |
| | p-type layer 40b | 180 | $SiH_4$: 100<br>$CH_4$: 100<br>$H_2$: 1000<br>$B_2H_6$: 50 | 100 | 30 (11 mW/cm²) | 3 |
| | Buffer layer | 180 | $SiH_4$: 6<br>$H_2$: 2000 | 200 | 300 (110 mW/cm²) | 10 |
| | i-type layer 42 | 180 | $SiH_4$: 50<br>$H_2$: 3000 | 600 | 600 (220 mW/cm²) | 2000 |
| | n-type layer 44 | 180 | $SiH_4$: 10<br>$H_2$: 2000<br>$PH_3$: 5 | 200 | 300 (110 mW/cm²) | 20 |

Table 11 shows the results, obtained for the photoelectric conversion devices in comparison examples 1 and 2 and in examples 1 to 5, by measuring an open circuit voltage Voc, a short-circuit current density Jsc, a fill factor FF and photoelectric conversion efficiency η. In Table 11, the measurement results for comparison example 1 are employed as 1 to normalize the measurement results for comparison example 2 and examples 1 to 5.

TABLE 11

| | Open Circuit Voltage Voc | Short-Circuit Current Density Jsc | FF | Efficiency η |
|---|---|---|---|---|
| Comparison example 1 | 1 | 1 | 1 | 1 |
| Comparison example 2 | 0.97 | 1.00 | 0.90 | 0.88 |
| Example 1 | 1.01 | 0.89 | 0.76 | 0.69 |
| Example 2 | 1.01 | 1.02 | 1.01 | 1.05 |
| Example 3 | 1.02 | 1.04 | 1.00 | 1.07 |
| Example 4 | 1.02 | 1.07 | 1.00 | 1.10 |
| Example 5 | 1.02 | 1.03 | 1.00 | 1.05 |

When example 1 is compared with comparison examples 1 and 2, the short-circuit current density Jsc and the fill factor FF are reduced, but the open circuit voltage Voc is increased by 1%, and the effects for insertion of the second p-type layer 40b can be obtained. In example 2, since the buffer layer 42a is additionally formed for the i-type layer 42 of the μc-Si unit 104, not only is the increase in the open circuit voltage Voc obtained, but also the reduction of the fill factor FF is suppressed, and the photoelectric conversion efficiency η is increased by 5% more than the efficiency in comparison example 1. Further, for example 3, the open circuit voltage Voc and the short-circuit current density Jsc are increased more than those in example 2, and the photoelectric conversion efficiency η is increased by 7% more than the efficiency in comparison example 1. In example 4, the short-circuit current density Jsc is increased more than in example 3, and the photoelectric conversion efficiency η is increased by 10% more than the efficiency in comparison example 1. Moreover, in example 5, the open circuit voltage Voc and the short-circuit current density Jsc are increased more than those in comparison example 1, and the photoelectric conversion efficiency η is increased by 5% more than the efficiency in comparison example 1.

Figure 4:
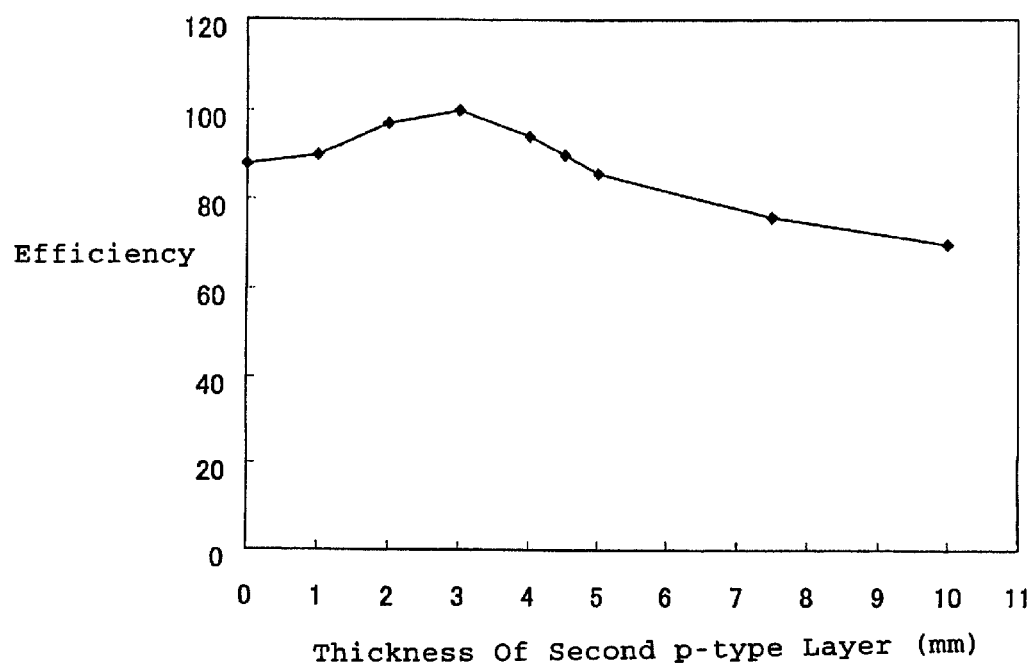
FIG. 4 is a diagram showing a relationship of the photoelectric conversion efficiency of a photoelectric conversion device, with respect to the film thickness of a second p-type layer according to example 6 of the present invention.

Further, as shown in FIG. 4 for thickness dependence of the second p-type layer 40b for example 6, when the film thickness is in the range of 1 nm or greater to 4.5 nm or smaller, the photoelectric conversion efficiency η reaches the maximum value of 90% or higher, which is a high value for photoelectric conversion efficiency. When the film thickness exceeds 4.5 nm, the series resistance of the photoelectric conversion device is increased, and the characteristics are degraded.

Figure 5:
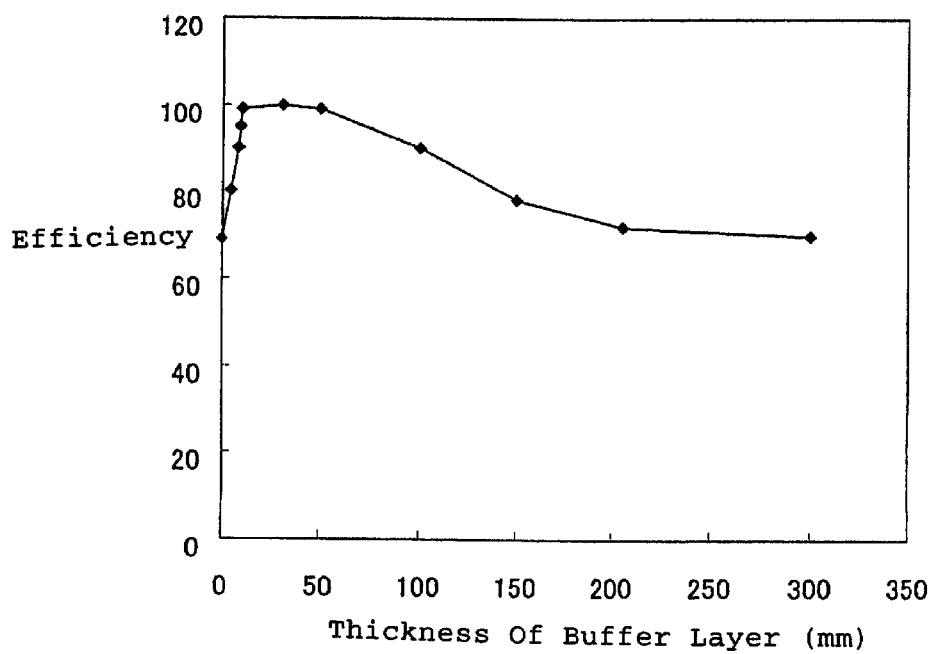
FIG. 5 is a diagram showing a relationship of the photoelectric conversion efficiency of a photoelectric conversion device, with respect to the film thickness of a buffer layer according to example 7 of the present invention.

Furthermore, as shown in FIG. 5 for thickness dependence of the buffer layer 42a for example 7, when the film thickness is 30 nm, the photoelectric conversion efficiency η has reached the maximum value, and when the film thickness is in the range of 10 nm or greater to 50 nm or smaller, the photoelectric conversion efficiency η indicates a high value. When the film thickness is in the range of 8 nm or greater to 100 nm or smaller, the photoelectric conversion efficiency η maintains the maximum value of 90% or higher, and a satisfactory improvement of characteristics is obtained.

Figure 6:
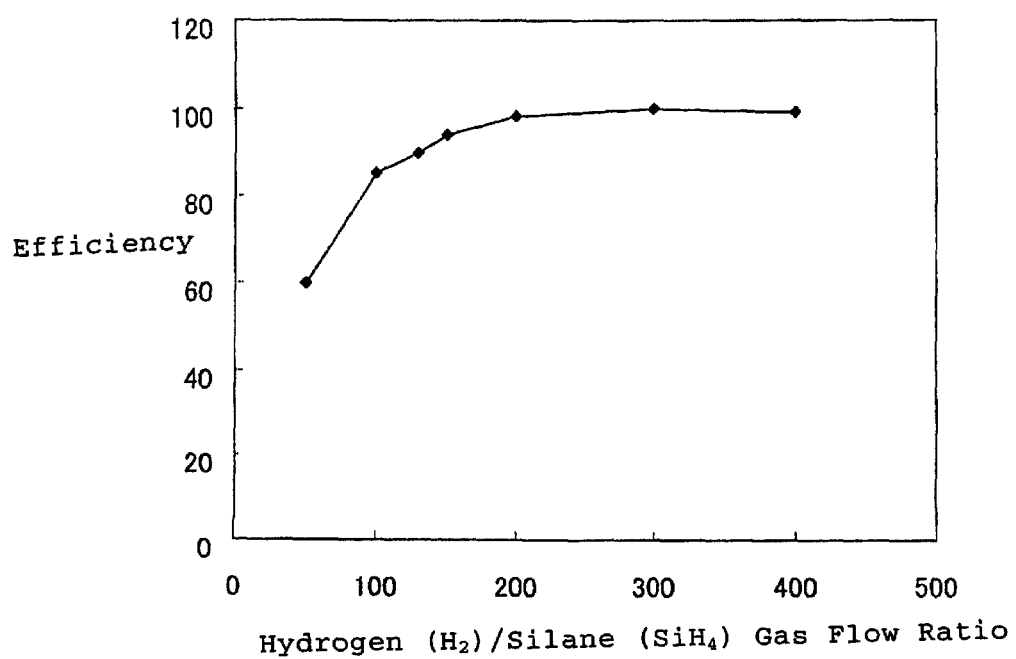
FIG. 6 is a diagram showing a relationship of the photoelectric conversion efficiency of a photoelectric conversion device, with respect to a hydrogen to silane dilution ratio at the time of deposition for a buffer layer according to example 8 of the present invention.

Further, as shown in FIG. 6 for dependence of example 8 on a hydrogen ($H_2$) to silane ($SiH_4$) dilution ratio at the time of formation of the buffer layer 42a, the photoelectric conversion efficiency η reaches its maximum in the vicinity of the dilution ratio of 250:1. Further, when the dilution ratio is 130:1 or higher, the photoelectric conversion efficiency η maintains the maximum value of 90% or higher, and satisfactory improvement of the characteristics is obtained. However, when the dilution ratio is greater than 800:1, an appropriate film deposition speed can not be obtained because of a relationship between the thickness of the buffer layer 42a and the takt time required for production, and therefore, it is preferable that the dilution ratio be 800:1 or less.

Further, Table 12 shows the results, obtained for the photoelectric conversion devices for comparison example 3 and example 9, by measuring the open circuit voltage Voc, the short-circuit current density Jsc, the fill factor FF and the photoelectric conversion efficiency η. In Table 11, the measurement results for comparison example 3 are employed as 1 to normalize the measurement results for example 9.

TABLE 12

| | Open Circuit Voltage Voc | Short-Circuit Current Density Jsc | FF | Efficiency η |
|---|---|---|---|---|
| Comparison example 3 | 1 | 1 | 1 | 1 |
| Example 9 | 1.02 | 1.04 | 1.00 | 1.06 |

In example 9, the open circuit voltage Voc and the short-circuit current density Jsc are increased more than in comparison example 3, and the photoelectric conversion efficiency η is improved by 6% more than in comparison example 3. Therefore, the present invention is useful not only for a tandem type photoelectric conversion device that includes the a-Si unit 102 and the μc-Si unit 104, but also for a single type photoelectric conversion device that includes only the μc-Si unit 104.

In example 10, the open circuit voltage Voc and the short-circuit current density Jsc are increased more than in comparison example 1, and the photoelectric conversion efficiency η is improved by 3% more than in comparison example 1. Therefore, the present invention is also useful for a case where, after the a-Si unit 102 has been formed, the whole structure is exposed to the air, and for the μc-Si unit 104, a p-type crystalline silicon semiconductor layer and a p-type amorphous silicon carbide layer are deposited as p-type layers, and then an i-type microcrystalline silicon layer (buffer layer) is deposited.

TABLE 13

|  | Open Circuit Voltage Voc | Short-Circuit Current Density Jsc | FF | Efficiency η |
|---|---|---|---|---|
| Comparison example 1 | 1 | 1 | 1 | 1 |
| Example 10 | 1.01 | 1.02 | 1.00 | 1.03 |

[Reference Signs List]

| 10: | transparent insulating substrate |
|---|---|
| 12: | transparent conductive film |
| 14: | intermediate film |
| 16: | first back-contact electrode layer |
| 18: | second back-contact electrode layer |
| 20: | filling material |
| 22: | protective film |
| 40: | p-type layer |
| 40a: | first p-type layer |
| 40b: | second p-type layer |
| 42: | i-type layer |
| 42a: | buffer layer |
| 42b: | main electricity-generating layer |
| 44: | n-type layer |
| 100: | photoelectric conversion device |
| 102: | amorphous silicon photoelectric conversion unit (a-Si unit) |
| 104: | microcrystalline silicon photoelectric conversion unit (μc-Si unit) |

The invention claimed is:

1. A photoelectric conversion device, which includes a photoelectric conversion unit formed by laminating a p-type layer containing a p-type dopant, an i-type layer that is a microcrystalline silicon layer employed as an electricity-generating layer, and an n-type layer containing an n-type dopant, characterized in that:
the p-type layer has a laminated structure of a first p-type layer, which is a microcrystalline silicon layer, and a second p-type layer, which is located between the p-type microcrystalline silicon layer and the i-type layer, and which includes at least one of a p-type amorphous silicon layer and a p-type amorphous silicon carbide layer, wherein the second p-type layer includes an oxide layer on a side close to the i-type layer.

2. The photoelectric conversion device according to claim 1, characterized in that:
a buffer layer that includes a microcrystalline silicon layer, which has been deposited under a condition that a crystallinity be higher than for the i-type layer, is arranged between the second p-type layer and the i-type layer.

3. The photoelectric conversion device according to claim 1, characterized in that:
a buffer layer having a laminated structure of an amorphous silicon layer and a microcrystalline silicon structure, which has been deposited under a condition that a crystallinity be higher than for the i-type layer, is arranged between the second p-type layer and the i-type layer.

4. The photoelectric conversion device according to one of claims 2, and 3, characterized in that a film thickness of the second p-type layer is equal to or greater than 1 nm to equal to or smaller than 4.5 nm.

5. The photoelectric conversion device according to claim 2, characterized in that a film thickness of the buffer layer is equal to or greater than 8 nm to equal to or smaller than 100 nm.

6. The photoelectric conversion device according to claim 1, characterized in that an amorphous silicon layer employed as an electricity-generating layer is laminated on a light incident side of the i-type layer.

7. A manufacturing method, for a photoelectric conversion device that includes a photoelectric conversion unit wherein a p-type layer containing a p-type dopant, an i-type layer that is a microcrystalline silicon layer and serves as an electricity-generating layer, and an n-type layer containing an n-type dopant are laminated, characterized by comprising the steps of:
forming, as p-type layers, a first p-type layer that is a microcrystalline silicon layer, and forming, between the p-type microcrystalline silicon layer and the i-type layer, a second p-type layer that includes, at least one of a p-type amorphous silicon layer or an p-type amorphous silicon carbide silicon layer; and
oxidizing an i-type layer side of the second p-type layer.

8. The producing method according to claim 7, characterized in that the step of oxidizing the side of the second p-type layer close to the i-type layer is a step of exposing, to the air, the p-type layer that has been formed.

9. The producing method according to claim 7 or 8, characterized by comprising a step of:
forming, between the second p-type layer and the i-type layer, a buffer layer that includes a microcrystalline silicon layer, which has been deposited under a condition that crystallinity be higher than for the i-type layer.

10. The producing method according to claim 7 or 8, characterized by comprising a step of:
forming, between the second p-type layer and the i-type layer, a buffer layer having a laminated structure of an amorphous silicon layer and a microcrystalline silicon structure, which has been deposited under a condition that crystallinity be higher than for the i-type layer.

11. The producing method according to claim 7, characterized in that:
a photoelectric conversion unit formed by laminating a second i-type layer, which is an amorphous silicon layer employed as an electricity-generating layer, is provided on a light incidence side of the i-type layer;
a step of forming the second i-type layer is further included before the step of forming the first p-type layer and the second p-type layer; and
a step of exposing to the air layers that are already deposited is not included between the step of forming the second i-type layer and the step of forming the first p-type layer and the second p-type layer.

* * * * *